United States Patent
Kendall et al.

(10) Patent No.: US 11,341,408 B2
(45) Date of Patent: May 24, 2022

(54) MEMRISTIVE LEARNING FOR NEUROMORPHIC CIRCUITS

(71) Applicant: University of Florida Research Foundation, Inc., Gainesville, FL (US)

(72) Inventors: Jack D. Kendall, Millbrae, CA (US); Juan C. Nino, Gainesville, FL (US)

(73) Assignee: University of Florida Research Foundation, Inc., Gainesville, FL (US)

(*) Notice: Subject to any disclaimer, the term of this patent is extended or adjusted under 35 U.S.C. 154(b) by 614 days.

(21) Appl. No.: 16/345,533

(22) PCT Filed: Oct. 27, 2017

(86) PCT No.: PCT/US2017/058757
§ 371 (c)(1),
(2) Date: Apr. 26, 2019

(87) PCT Pub. No.: WO2018/081560
PCT Pub. Date: May 3, 2018

(65) Prior Publication Data
US 2019/0311263 A1 Oct. 10, 2019

Related U.S. Application Data

(60) Provisional application No. 62/413,666, filed on Oct. 27, 2016.

(51) Int. Cl.
*G06N 3/08* (2006.01)
*G06N 3/04* (2006.01)
(Continued)

(52) U.S. Cl.
CPC .............. *G06N 3/08* (2013.01); *G06N 3/049* (2013.01); *G06N 3/063* (2013.01); *G06N 3/0635* (2013.01);
(Continued)

(58) Field of Classification Search
CPC ...... G06N 3/049; G06N 3/063; G06N 3/0635; G06N 3/08; G11C 11/54
See application file for complete search history.

(56) References Cited

U.S. PATENT DOCUMENTS

| 4,926,064 A | 5/1990 | Tapang |
| 5,446,828 A | 8/1995 | Woodall |

(Continued)

FOREIGN PATENT DOCUMENTS

EP 2230633 9/2010

OTHER PUBLICATIONS

Moon, Kibong, et al. "ReRAM-based analog synapse and IMT neuron device for neuromorphic system." 2016 International Symposium on VLSI Technology, Systems and Application (VLSI-TSA). IEEE, Apr. 2016. (Year: 2016).*
(Continued)

*Primary Examiner* — Benjamin P Geib
(74) *Attorney, Agent, or Firm* — Thomas |Horstemeyer, LLP

(57) ABSTRACT

Memristive learning concepts for neuromorphic circuits are described. In one example case, a neuromorphic circuit includes a first oscillatory-based neuron that generates a first oscillatory signal, a diode that rectifies the first oscillatory signal, and a synapse coupled to the diode and including a long-term potentiation (LTP) memristor arranged in parallel with a long-term depression (LTD) memristor. The circuit further includes a difference amplifier coupled to the synapse that generates a difference signal based on a difference between output signals from the LTP and LTD memristors, and a second oscillatory-based neuron electrically coupled to the difference amplifier that generates a second oscillatory signal based on the difference signal. The circuit also includes a feedback circuit that provides a feedback signal to
(Continued)

the LTP and LTD memristors based on a difference or error between a target signal and the second oscillatory signal.

20 Claims, 4 Drawing Sheets

(51) Int. Cl.
    *G06N 3/063*     (2006.01)
    *G11C 11/54*     (2006.01)
    *G11C 13/00*     (2006.01)

(52) U.S. Cl.
    CPC .............. *G06N 3/088* (2013.01); *G11C 11/54* (2013.01); *G11C 13/0069* (2013.01); *G11C 2213/72* (2013.01); *G11C 2213/78* (2013.01)

(56) References Cited

U.S. PATENT DOCUMENTS

| | | |
|---|---|---|
| 6,581,046 B1 | 6/2003 | Ahissar |
| 7,280,989 B1 | 10/2007 | Hoppensteadt et al. |
| 8,433,665 B2 | 4/2013 | Tang et al. |
| 9,053,428 B2 | 6/2015 | Hunzinger et al. |
| 9,087,302 B2 | 7/2015 | Sim et al. |
| 2010/0220523 A1 | 9/2010 | Modha et al. |
| 2010/0299296 A1 | 11/2010 | Modha et al. |
| 2010/0299297 A1 | 11/2010 | Breitwisch et al. |
| 2011/0004579 A1 | 1/2011 | Snider |
| 2012/0011088 A1 | 1/2012 | Aparin et al. |
| 2012/0011090 A1 | 1/2012 | Tang et al. |
| 2012/0011093 A1 | 1/2012 | Aparin et al. |
| 2012/0194967 A1 | 8/2012 | Keane et al. |
| 2014/0122402 A1 | 5/2014 | Bichler et al. |
| 2015/0088797 A1* | 3/2015 | Kim ....................... G06N 3/049 706/29 |
| 2015/0106316 A1 | 4/2015 | Birdwell et al. |

OTHER PUBLICATIONS

Deng, Lei, et al. "Complex learning in bio-plausible memristive networks." Scientific reports 5.1 (Jun. 2015): 1-10. (Year: 2015).*
F. Hoppensteadt; et al (2000) "Pattern Recognition via Synchronization in Phase-Locked Loop Neural Networks." IEEE Transactions on Neural Networks, 11(3), pp. 734-738.
W. Gerstner; et al (1993) "Why Spikes? Hebbian Learning and Retrieval of Time-Resolved Excitation Patterns" Biol. Cybern. 69, pp. 503-515.
T. Masquelier; et al (2008) "Spike Timing Dependent Plasticity Finds the Start of Repeating Patterns in Continuous Spike Trains" PLoS ONE 3(1): e1377 pp. 1-9.
T. Masquelier; et al (2009) "Competitive STDP-Based Spike Pattern Learning" Neural Computation 21, pp. 1259-1276.
G. Bi; et al (1998) "Synaptic Modifications in Cultured Hippocampal Neurons: Dependence on Spike Timing, Synaptic Strength, and Postsynaptic Cell Type" The Journal of Neuroscience 18(24):pp. 10464-10472.
B. Linares-Barranco; et al (2009) "Memristance can explain Spike-Time-Dependent-Plasticity in Neural Synapses" pp. 1-4.
D. Strukov; et al (2008) "The Missing Memristor Found" Nature, 453(7191), pp. 80-83.
J. Borghetti; et al (2009) "A Hybrid Nanomemristor/Transistor Logic Circuit Capable of Self-Programming" PNAS, 106 (6), pp. 1699-1703.
S. Jo; et al (2008) "High-Density Crossbar Arrays Based on a Si Memristive System" Nano Lett., 9(2), pp. 870-874.
L. Chua (1971) "Memristor—The Missing Circuit Element" IEEE Transactions on circuit theory, 18(5), pp. 507-519.
G. Snider (2008) "Spike-Timing-Dependent Learning in Memristive Nanodevices." In Proceedings of the 2008 IEEE International Symposium on Nanoscale Architectures (pp. 85-92). IEEE Computer Society.
D. Strukov; et al (2005) "CMOL FPGA: A Reconfigurable Architecture for Hybrid Digital Circuits With Two-Terminal Nanodevices" Nanotechnology 16, pp. 888-900.
R. Serrano-Gotarredona; et al (2006) "A Neuromorphic Cortical-Layer Microchip for Spike-Based Event Processing Vision Systems" IEEE Transactions On Circuits and Systems—I: Regular Papers, 53(12), pp. 2548-2566.
R. Serrano-Gotarredona; et al (2008) "On Real-Time AER 2-D Convolutions Hardware for Neuromorphic Spike-Based Cortical Processing" IEEE Transactions On Neural Networks, 19(7), pp. 1196-1219.
P. Lichtsteiner; et al (2008) "A $128\times 128$ 120 dB $15\mu$ s Latency Asynchronous Temporal Contrast Vision Sensor." IEEE journal of solid-state circuits, 43(2), pp. 566-576.
M. Oster; et al (2008) "Quantification of a Spike-Based Winner-Take-All VLSI Network" IEEE Transactions on Circuits and Systems—Part I: Regular Papers, 55(10), pp. 3160-3169.
R. Serrano-Gotarredona; et al (2009) "CAVIAR: A 45k Neuron, 5M Synapse, 12G Connects/s AER Hardware Sensory—Processing—Learning—Actuating System for High-Speed Visual Object Recognition and Tracking" IEEE Transactions On Neural Networks, 20(9), pp. 1417-1438.
A. Afifi; et al (2009) "STDP Implementation Using Memristive Nanodevice in CMOS-Nano Neuromorphic Networks." IEICE Electronics Express, 6(3), pp. 148-153.
S. Jo; et al (2010) "Nanoscale Memristor Device as Synapse in Neuromorphic Systems" Nano Lett. 10, pp. 1297-1301.
G. Hinton; et al (1995) "The Wake-Sleep Algorithm for Unsupervised Neural Networks" Science, 268(5214), pp. 1158-1161.
J. Bill; et al (2015) "Distributed Bayesian Computation and Self-Organized Learning in Sheets of Spiking Neurons with Local Lateral Inhibition." PLoS ONE 10(8), pp. 1-51.
P. Dayan; et al (1995) "The Helmholtz Machine." Neural computation, 7(5), pp. 889-904.
P. Dayan (2000) "Helmholtz Machines and Wake-Sleep Learning." Handbook of Brain Theory and Neural Network. MIT Press, Cambridge, MA, 44(0), pp. 1-12.
P. Sountsov; et al (2015) Spiking neuron network Helmholtz machine. Frontiers in computational neuroscience,vol. 9, Article 46, pp. 1-24.
D. Feldman, (2009) "Synaptic Mechanisms for Plasticity in Neocortex." Annual Review of Neuroscience, 32, pp. 33-55.
G. Koch; et al (2013) "Hebbian and Anti-Hebbian Spike-Timing-Dependent Plasticity of Human Cortico-Cortical Connections." Journal of Neuroscience, 33(23), pp. 9725-9733.
Freeman; et al (2008) "Freeman K-Set." Scholarpedia, 3(2), p. 3238.
Y. Pershin; et al (2010) "Experimental Demonstration of Associative Memory With Memristive Neural Networks." Neural Networks, 23(7), pp. 881-886.
D.O. Hebb (1949) "Th Organization of Behavior: A Neuropsychological Theory" John Wiley & Sons, Inc., New York.
International Search Report and Written Opinion for PCT/US17/58757 dated Jan. 18, 2018.

* cited by examiner

MEMRISTIVE LEARNING FOR NEUROMORPHIC CIRCUITS

CROSS-REFERENCE TO RELATED APPLICATIONS

This application is a 35 U.S.C. § 371 national stage application of PCT Application No. PCT/US2017/058757, entitled "MEMRISTIVE LEARNING FOR NEUROMORPHIC CIRCUITS," filed Oct. 27, 2017, which claims the benefit of priority to U.S. Provisional Application No. 62/413,666, filed Oct. 27, 2016, the entire contents of both of which applications are hereby incorporated herein by reference.

BACKGROUND

A memristor is a passive non-linear two-terminal electrical component. In a memristor, the electrical resistance of the device depends on a history of current that previously flowed through the device. Thus, the resistance or impedance of a memristor at any given time depends on how much electric charge flowed through the memristor, and in what direction, previously.

The use of memristors for synaptic networks has been proposed as a promising approach in the field of neuromorphic circuit development. Memristors have been incorporated into crossbar synapse networks with complementary metal oxide semiconductor (CMOS)-based circuitry for presynaptic and postsynaptic voltage control. Those circuits demonstrate that CMOS-based voltage and current control can be used to generate changes in the resistance or impedance (e.g., memory) of memristors.

SUMMARY OF THE INVENTION

In one example, a memristive learning neuromorphic circuit includes a first oscillatory-based neuron that generates a first oscillatory signal, a diode electrically coupled to the first oscillatory-based neuron that rectifies the first oscillatory signal, a synapse electrically coupled to the diode, a difference amplifier electrically coupled to the synapse, and a second oscillatory-based neuron electrically coupled to the difference amplifier that generates a second oscillatory signal based on a difference signal generated by the difference amplifier. The synapse can include a long-term potentiation (LTP) memristor arranged in parallel with a long-term depression (LTD) memristor, and the difference amplifier can generate the difference signal based on a difference between output signals from the LTP memristor and the LTD memristor.

According to one aspect, the memristive learning neuromorphic circuit can also include a feedback circuit that provides a feedback signal to the LTP memristor and the LTD memristor based on an error between a target signal and the second oscillatory signal. The feedback circuit can provide a first feedback signal to the LTP memristor and provide a second feedback signal to the LTD memristor, where the first feedback signal is anti-phase with the second feedback signal. The feedback circuit can adjust a phase of at least one of the first feedback signal and the second feedback signal according to the difference or error between a target signal and the second oscillatory signal.

According to another aspect, the first oscillatory signal can comprise a magnitude and a phase, and the magnitude can be used in the memristive learning neuromorphic circuit to transmit information between the first oscillatory-based neuron and the second oscillatory-based neuron. Further, the phase can be used to modify a connection strength between the first oscillatory-based neuron and the second oscillatory-based neuron.

In another example, a method of memristive learning includes generating a first oscillatory signal, rectifying the first oscillatory signal to generate a rectified oscillatory signal, and providing the rectified oscillatory signal to an input of a first memristor and to an input of a second memristor. The first memristor can be arranged in parallel with the second memristor. The method can also include generating a difference signal based on a difference between an output of the first memristor and an output of the second memristor, and generating a second oscillatory signal based on the difference signal.

In other aspects, the method can include comparing the second oscillatory signal to a target signal, and providing a feedback signal to one of the first memristor or the second memristor based on an error between the target signal and the second oscillatory signal. The feedback signal can be provided to both the first and second memristors in some cases. Further, the method can include providing a first feedback signal to the first memristor, and providing a second feedback signal to the second memristor. The first feedback signal can be anti-phase with the second feedback signal in some cases. Providing the feedback signal can include adjusting a phase of at least one of the first feedback signal or the second feedback signal according to the error between the target signal and the second oscillatory signal.

BRIEF DESCRIPTION OF THE DRAWINGS

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

Figure 1A:
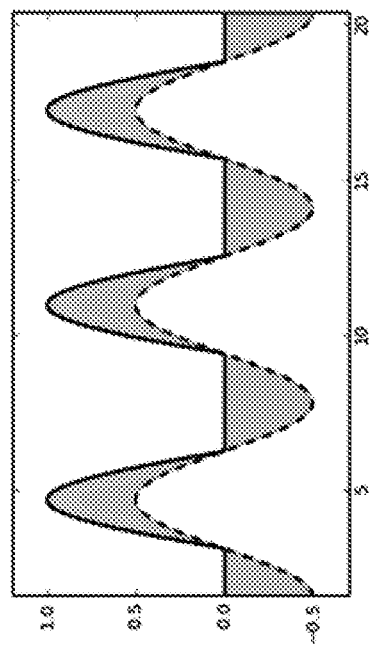
FIGS. 1A and 1B illustrate examples of voltage signals that can be used for memristive learning according to various examples described herein.

As noted above, the use of memristors for synaptic networks has been proposed in the field of neuromorphic circuit development. Memristors have been incorporated into crossbar synapse networks, for example, with complementary metal oxide semiconductor (CMOS)-based circuitry for presynaptic and postsynaptic voltage control. Those circuits demonstrate that CMOS-based voltage and current control can be used to generate changes in the resistance or impedance (e.g., memory) of memristors.

The concepts described herein are directed to hardware-based neural networks (e.g., neuromorphic circuits and hardware) using memristive synapses and oscillatory neurons and method for training such networks. The approach is localized and does not require external circuits for weight updates, pulse generation, or event detection. The goal of the learning rules described herein is to approximate the delta rule used for training neural networks. In machine learning, the delta rule is a gradient descent learning rule for updating the weights of the inputs to artificial neurons in a single-layer neural network.

For linear neurons, the delta rule has the following form:

$$\Delta w_{ji} = \alpha(t_j - y_j)x_i \quad (1)$$

In Equation (1), $\Delta w_{ji}$ is the change in the weight from neuron i to neuron j, $\alpha$ is a constant learning rate, $t_j - y_j$ is the error of neuron j, with $y_j$ its actual output and $t_j$ its target output, and $x_i$ is the output of neuron i.

If the actual output of neuron j is less than its target, the weight update is positive. This would effectively increase the output of neuron j if shown the same input again, decreasing the error. Similarly, if the actual output is greater than its target, the weight update is negative. This makes intuitive sense, because the weights should be updated to minimize the magnitude of the error.

Different types of neurons with different activation functions will yield different versions of the delta rule. However, the dependence on the error $t_j - y_j$ remains the same, and is the most critical part of the rule. Therefore, approximations to the delta rule preserve the dependence on the error $t_j - y_j$.

Whereas standard rate-based neurons can represent only real-valued numbers in the form of currents or voltages, oscillatory-based neurons are capable of representing complex-valued numbers with both magnitude and phase. The learning concepts described herein use the magnitude of the oscillation of an oscillatory-based neuron to transmit information to other oscillatory-based neurons, representing $x_i$ and $y_j$, while the phase of the oscillation is used to modify its connection strength to the other oscillatory-based neurons.

The oscillatory signals of two neurons can be used to update the connection weight between them by exploiting a property of memristors known as the threshold voltage. Below the threshold voltage of a memristor, no change in resistance (and thus weight) occurs. Above this threshold, however, the resistance will either increase or decrease depending on the direction (e.g., polarity) of the voltage drop across the memristor. This property has been exploited in spiking neuron models to implement spike-timing-dependent plasticity (STDP). However, an analogous rule for oscillatory, phase-based neuron models has yet to be described.

Figure 1B:
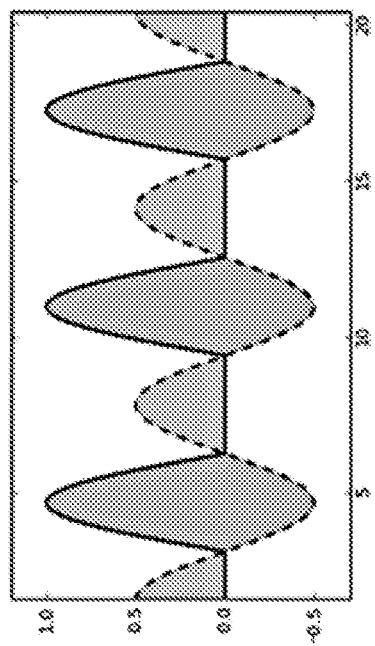

FIGS. 1A and 1B illustrate examples of voltage signals that can be used for memristive learning according to various examples described herein. In FIGS. 1A and 1B, two voltage signals generated by two different oscillators are superimposed. The voltage signals respectively correspond to voltages at opposite ends of a memristor (i.e., pre- and post-memristor ends) over time. The pre-memristor synaptic voltage signal is a rectified sine wave (solid line), while the post-memristor synaptic voltage signal is an unrectified sine wave (dashed line).

In FIG. 1A, the pre- and post-memristor voltage signals are in-phase. The maximum voltage drop across the memristor in that case is 0.5 V, which can be below the threshold voltage of the memristor. Thus, no change in resistance occurs in the memristor. In FIG. 1B, the pre- and post-memristor voltage signals are out-of-phase. The maximum voltage drop across the memristor in that case is 1.5 V, which can be greater than the threshold voltage of memristor. Thus, a change in resistance occurs in the memristor for the FIG. 1B case but not the FIG. 1A case. Under this construct, whether or not the weight (e.g., operating characteristic or resistance of the memristor) is changed or updated depends on the relative phases of the pre- and post-memristor voltages. This shows that memristance can be changed by changing the relative phase between the two oscillators or oscillatory-based neurons, analogous to STDP.

In a typical feed-forward neural network, the activities of the neurons are not influenced by the immediate error or future weight updates. Because of this, it is important that the activity of a particular neuron not be influenced by its error, or by the direction in which its weights are changing at a given time. Therefore, in the proposed learning concepts, the magnitude of the oscillation of an oscillatory-based neuron, which determines activity, can be controlled independently of the phase of the oscillation of the oscillatory-based neuron, which governs learning, and is guided by the error.

If either the pre- or post-memristor voltage signals shown in FIGS. 1A and 1B is applied across a memristor, it can be shown that the total current through the memristor is independent of the phase difference between the voltage signals shown in FIGS. 1A and 1B. This can be understood by observing FIGS. 1A and 1B. To satisfy the above criterion, the current flowing from the pre-synaptic neuron to the post-synaptic neuron should be independent of the relative phases of the two oscillatory-based neurons. This can be conveniently achieved by adding a leaky integrator, low pass filter, or moving average filter immediately after the synaptic memristor, before entering the post-synaptic oscillatory-based neuron. Since the integral of a pure sine wave is zero, only the rectified sine wave from the presynaptic neuron will contribute to the current flowing into the postsynaptic neuron. In other words, since the integrals of the post-memristor voltage signals (dashed line) shown in both FIG. 1A and FIG. 1B are the same, the total current will be the same regardless of which pair of the signals shown in FIG. 1A and FIG. 1B is applied across the memristor, independent of the relative phases of the pair of the signals.

Thus, it can been demonstrated that the strength of a memristive connection can be altered by adjusting the relative phase of two oscillatory-based neurons, and that the total input from one oscillatory-based neuron into the other is independent of this relative phase. Based on that finding, an architecture to implement an efficient approximation to the delta rule is described below.

Figure 2:
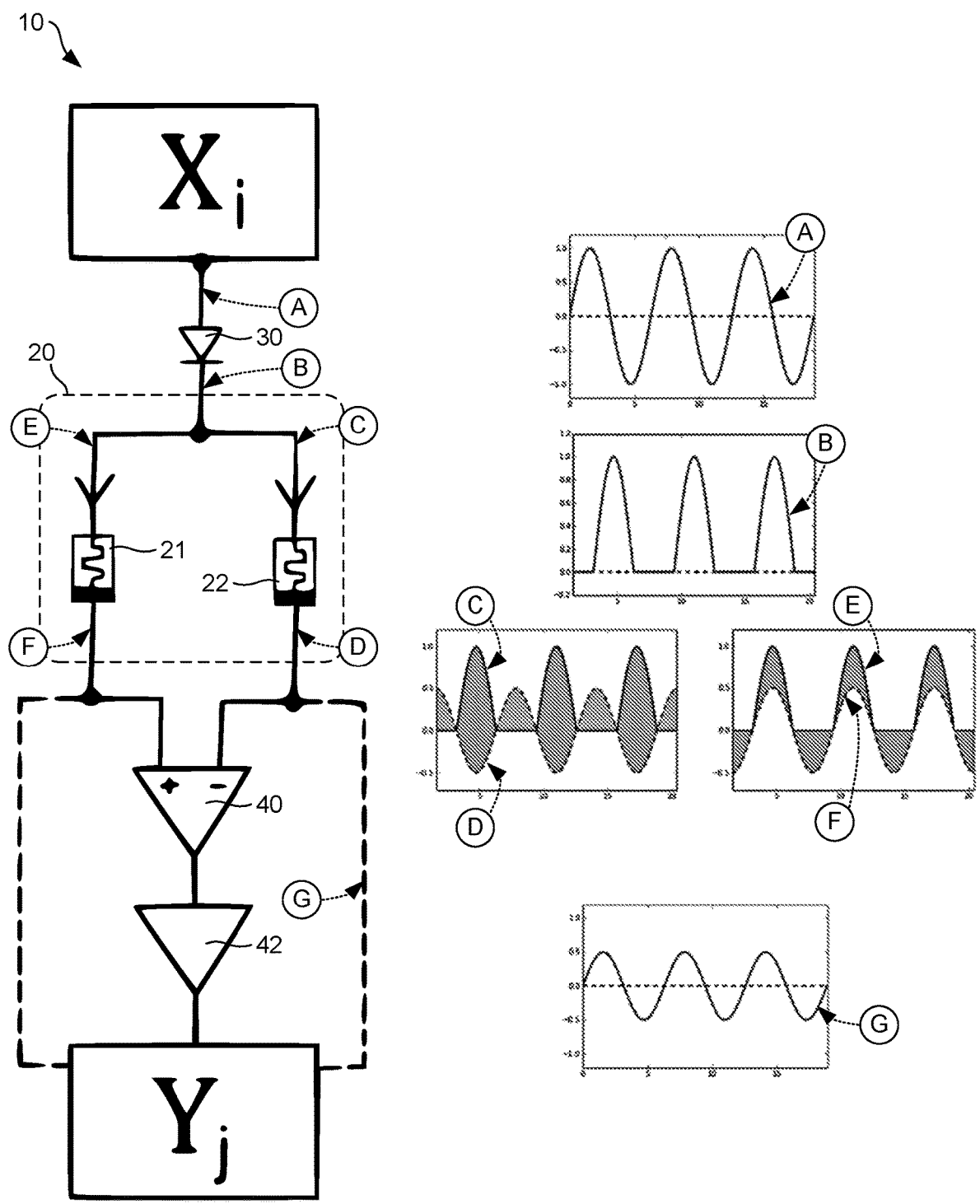
FIG. 2 illustrates an example neuromorphic circuit that incorporates the concepts of memristive learning according to various examples described herein.

FIG. 2 illustrates an example neuromorphic circuit 10 that incorporates the concepts of memristive learning according to various examples described herein. As shown in FIG. 2, the architecture can be understood by observing two oscillators, $X_i$ and $Y_j$, which are representative of two different neurons. The oscillators $X_i$ and $Y_j$ can be embodied as any suitable type of oscillator, such as a phase-locked loop. Thus, the oscillators $X_i$ and $Y_j$ can include a control system that generates an output signal having a phase related to the phase of an input signal. As one example, the oscillators $X_i$ and $Y_j$ can include a variable frequency oscillator and a phase detector coupled in a feedback control loop. The oscillator can generate a periodic, oscillating output signal, and the phase detector can compare the phase of the output signal with the phase of a periodic input signal. The output of the phase detector can be provided as an input to the variable frequency oscillator to keep the phases of the input and output signals matched.

The two oscillatory-based neurons $X_i$ and $Y_j$ are coupled by a synapse 20 comprising two memristors 21 and 22. The voltage output from both the oscillatory-based neurons $X_i$ and $Y_j$ are assumed in one example to be pure sine waves (e.g., see the A and G waveforms in FIG. 2), although other waveforms could be used. In the structure shown in FIG. 2, the post-synaptic oscillatory-based neuron $Y_j$ receives input from the presynaptic oscillatory-based neurons $X_i$. Additionally, the memristors 21 and 22 are representative of a synapse that presents connection "weights" between the two oscillatory-based neurons $X_i$ and $Y_j$. The two memristors 21 and 22 represent a single synapse and allow for both positive and negative connections as described below.

In various embodiments, the memristors 21 and 22 can be embodied as any suitable memristor having a threshold voltage that regulates the flow of electrical current based on or in accordance with the amount of charge that has previously flowed through it. For example, the electrical resistance of each of the memristors 21 and 22 is not constant but depends on a history of the amount of current that had previously flowed through each of them. Thus, the resistance of each of the memristors 21 and 22, at any given time, depends on how much electric charge has previously flowed through the device, and in what direction.

One of the memristors 21 and 22 in the synapse 20 can be designated the long-term potentiation (LTP) memristor, and the other can be designated the long-term depression (LTD) memristor. By increasing the conductance of the LTP memristor, the connection strength between the two oscillators $X_i$ and $Y_j$ is strengthened. On the other hand, by increasing the conductance of the LTD memristor, the connection between the two oscillators $X_i$ and $Y_j$ is weakened.

A diode 30 is provided at the output of the oscillatory-based neuron $X_i$. The diode 30 rectifies the sine wave output of the oscillator $X_i$ as shown in the B waveform in FIG. 2. This rectified signal is then passed to the synapse 20 comprising the two memristors 21 and 22. The memristors 21 and 22 in the synapse 20 also receive separate post-memristor sinusoidal feedback signals based on the error of the oscillatory-based neuron $Y_j$. These feedback signals then modify the resistance of one of the memristors 21 and 22 by changing their phase, depending on whether the synapse 20 is to be strengthened or weakened.

After the synapse 20, the difference in current flowing between the two memristors 21 and 22 can be determined by a difference amplifier 40 and provided as a difference feedback signal. The output of the difference amplifier 40 can be passed to a low-pass filter 42 which integrates the difference feedback signal and eliminates the effects of phase differences between the input and feedback signals. The relatively constant current from the low-pass filter 42 is then provided as input to the oscillatory-based neuron Yj.

The neuromorphic circuit 10 uses a two-memristor synapse 20 rather than a single-memristor synapse for two reasons. The first reason is that a two-memristor synapse allows for the practical implementation of both positive and negative weights. By having one memristor (e.g., the LTD memristor) act as a negative weight and the other memristor (e.g., the LTP memristor) act as a positive weight, the currents through each can be subtracted to give a current which is either positive or negative.

The second reason is that the proposed learning concepts allow for only one of the two memristors 21 and 22 to be either strengthened or weakened at a time, depending on how the voltage at $X_i$ is rectified. Having both a positive and a negative memristor allows the synapse 20 be strengthened by simply strengthening the positive memristor. On the other hand, the synapse 20 can be weakened by strengthening the negative memristor.

To prevent the saturation of both the memristors 21 and 22 from constant strengthening, the direction of the voltage rectification (e.g., of the diode 30) can be changed while simultaneously inverting the current from the oscillatory-based neurons $X_i$ and $Y_j$. In this way, the dynamics remain the same, however each of the memristors 21 and 22 is now being weakened rather than strengthened. Alternating these two regimes can then prevent saturation.

Figure 3:
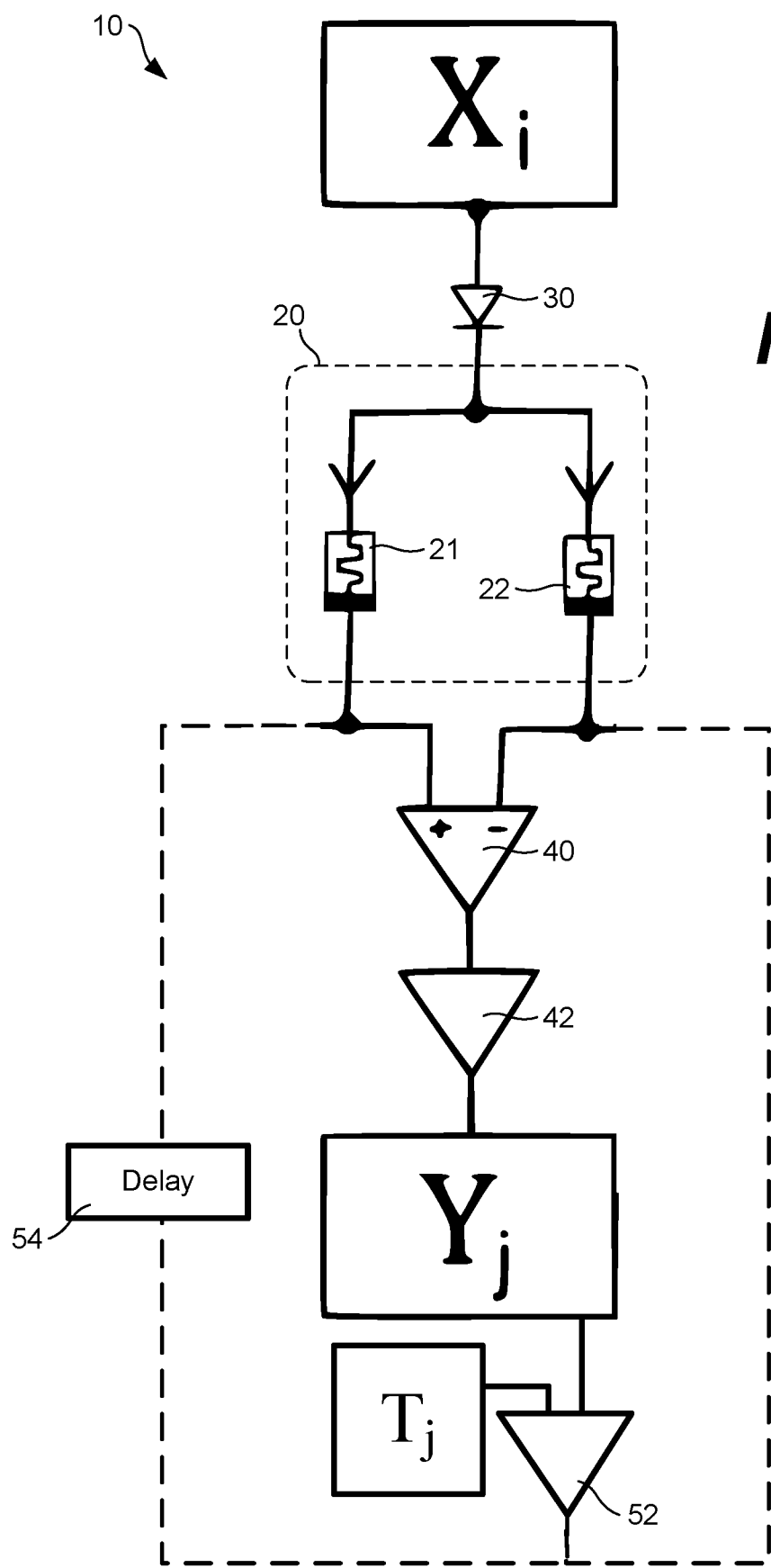
FIG. 3 further illustrates the example neuromorphic circuit shown in FIG. 2 according to various examples described herein.

FIG. 3 further illustrates the example neuromorphic circuit 10 shown in FIG. 2. To update the connection "weights" between the two oscillatory-based neurons $X_i$ and $Y_j$, the comparator 52 determines the difference between the target output, $T_j$, and the actual output $Y_j$. The output of the comparator 52 is representative of an error between the target output and the actual output $Y_j$. If this is positive, the feedback signal to the negative memristor 22, for example, remains in phase with its input signal, while the feedback signal to the positive memristor 21, for example, is passed through a delay stage 54 such that it is anti-phase (i.e., opposite in phase) with its input signal. This will therefore strengthen the synapse 20 as required by the delta rule. In the opposite case, where the difference between $T_j$ and $Y_j$ is negative, the feedback signal to the positive memristor 21 remains in phase, while the feedback signal to the negative memristor 22 becomes anti-phase. In this way, the magnitude of the error for each training case will decrease, so long as the learning rate $\alpha$ is sufficiently low. As long as the input signals are synchronized, this can be generalized to the case of multiple input units and multiple output units.

Figure 4:
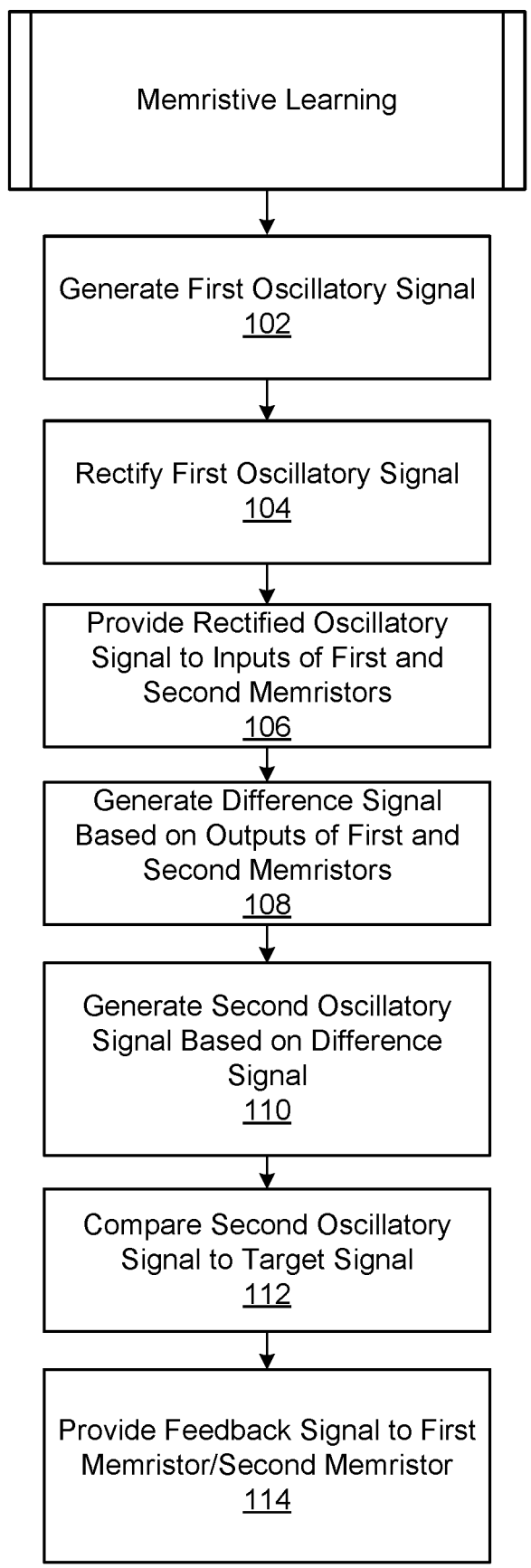
FIG. 4 illustrates an example process for memristive learning using the neuromorphic circuit shown in FIG. 2 according to various examples described herein.

FIG. 4 illustrates an example process for memristive learning using the neuromorphic circuit shown in FIGS. 2 and 3 according to various examples described herein. At step 102, the process includes generating a first oscillatory signal. For example, the oscillator $X_i$ can generate a first oscillatory signal as described above with reference to FIGS. 2 and 3. At step 104, the process includes rectifying the first oscillatory signal generated at step 102 to generate a rectified oscillatory signal. For example, the diode 30 can rectify the output of the oscillator $X_i$.

At step 106, the process includes providing the rectified oscillatory signal to an input of a first memristor and to an input of a second memristor. As shown in the examples in FIGS. 2 and 3, the output of the diode 30 is provided to the synapse 20, which includes memristor 21 arranged in parallel with the memristor 22.

At step 108, the process includes generating a difference signal based on a difference between an output of the first memristor and an output of the second memristor. For example, the difference amplifier 40 can generate a difference signal based on a difference between the output of the memristor 21 and an output of the memristor 22.

At step 110, the process includes generating a second oscillatory signal based on the difference signal generated at step 108. As described in the examples above, the oscillator $Y_j$ receives the difference signal generated by the difference amplifier 40 and generates a second oscillatory signal based on the difference signal generated by the difference amplifier 40.

At step 112, the process includes comparing the second oscillatory signal generated at step 110 to a target signal to provide an error. As shown in FIG. 3, for example, the comparator 52 compares the target output signal, $T_j$, and the second oscillatory signal output from the oscillator $Y_j$. The output of the comparator 52 is representative of an error between the target signal and the second oscillatory signal.

At step 114, the process includes providing a feedback signal to one or both of the memristor 21 and memristor 22 in the synapse 20 based on the error between the target signal and the second oscillatory signal. As described above, if this error is positive, the feedback signal to the memristor 22 remains in phase with its input signal, while the feedback signal to the memristor 21 is passed through a delay stage 54 such that it is anti-phase with its input signal. This will strengthen the synapse 20 as required by the delta rule. In the opposite case, where the difference between $T_j$ and $Y_j$ is negative, the feedback signal to the memristor 21 remains in phase, while the feedback signal to the memristor 22 becomes anti-phase. In this way, the magnitude of the error for each training case will decrease, so long as the learning rate $\alpha$ is sufficiently low.

The above-described examples of the present disclosure are merely possible examples of implementations set forth for a clear understanding of the principles of the disclosure. Many variations and modifications can be made without departing substantially from the spirit and principles of the disclosure. All modifications and variations are intended to be included herein within the scope of this disclosure and protected by the following claims.

Therefore, the following is claimed:

1. A memristive learning neuromorphic circuit, comprising:
   a first oscillatory-based neuron that generates a first oscillatory signal;
   a synapse electrically coupled to the first oscillatory-based neuron and comprising a plurality of memristors;
   a difference amplifier electrically coupled to the synapse that generates a difference signal based on a difference between output signals from the plurality of memristors; and
   a second oscillatory-based neuron electrically coupled to the difference amplifier that generates a second oscillatory signal based on the difference signal.

2. The memristive learning neuromorphic circuit of claim 1, further comprising a feedback circuit that provides a feedback signal to synapse based on an error between a target signal and the second oscillatory signal.

3. The memristive learning neuromorphic circuit of claim 2, further comprising a diode electrically coupled to the first oscillatory-based neuron that rectifies the first oscillatory signal.

4. The memristive learning neuromorphic circuit of claim 2, wherein the plurality of memristors comprise a long-term potentiation (LTP) memristor arranged in parallel with a long-term depression (LTD) memristor.

5. The memristive learning neuromorphic circuit of claim 4, wherein the feedback circuit provides a first feedback signal to the LTP memristor and provides a second feedback signal to the LTD memristor.

6. The memristive learning neuromorphic circuit of claim 5, wherein the first feedback signal is anti-phase with the second feedback signal.

7. The memristive learning neuromorphic circuit of claim 5, wherein the feedback circuit adjusts a phase of at least one of the first feedback signal and the second feedback signal according to the difference or error between the target signal and the second oscillatory signal.

8. The memristive learning neuromorphic circuit of claim 1, wherein:
   the first oscillatory signal comprises a magnitude and a phase; and
   in the memristive learning neuromorphic circuit, the magnitude is used to transmit information between the first oscillatory-based neuron and the second oscillatory-based neuron and the phase is used to modify a connection strength between the first oscillatory-based neuron and the second oscillatory-based neuron.

9. A method of memristive learning, comprising;
   generating a first oscillatory signal;
   rectifying the first oscillatory signal to generate a rectified oscillatory signal;
   providing the rectified oscillatory signal to an input of a first memristor and to an input of a second memristor, the first memristor being arranged in parallel with the second memristor;
   generating a difference signal based on a difference between an output of the first memristor and an output of the second memristor; and
   generating a second oscillatory signal based on the difference signal.

10. The method of memristive learning according to claim 9, further comprising:
    comparing the second oscillatory signal to a target signal; and
    providing a feedback signal to one of the first memristor or the second memristor based on an error between the target signal and the second oscillatory signal.

11. The method of memristive learning according to claim 10, wherein providing the feedback signal comprises providing the feedback signal to the first memristor and the second memristor.

12. The method of memristive learning according to claim 10, wherein providing the feedback signal comprises:
    providing a first feedback signal to the first memristor; and
    providing a second feedback signal to the second memristor, wherein the first feedback signal is anti-phase with the second feedback signal.

13. The method of memristive learning according to claim 12, wherein providing the feedback signal further comprises adjusting a phase of at least one of the first feedback signal or the second feedback signal according to the error between the target signal and the second oscillatory signal.

14. The method of memristive learning according to claim 10, wherein the first memristor comprises a long-term potentiation (LTP) memristor and the second memristor comprises a long-term depression (LTD) memristor.

15. A memristive learning neuromorphic circuit, comprising:
    a first oscillatory-based neuron that generates a first oscillatory signal;
    a diode electrically coupled to the first oscillatory-based neuron that rectifies the first oscillatory signal;
    a synapse electrically coupled to the diode and comprising a long-term potentiation (LTP) memristor arranged in parallel with a long-term depression (LTD) memristor;
    a difference amplifier electrically coupled to the synapse that generates a difference signal based on a difference between output signals from the LTP memristor and the LTD memristor; and
    a second oscillatory-based neuron electrically coupled to the difference amplifier that generates a second oscillatory signal based on the difference signal.

16. The memristive learning neuromorphic circuit of claim 15, further comprising a feedback circuit that provides a feedback signal to the LTP memristor and the LTD memristor based on an error between a target signal and the second oscillatory signal.

17. The memristive learning neuromorphic circuit of claim 16, wherein the feedback circuit provides a first feedback signal to the LTP memristor and provides a second feedback signal to the LTD memristor.

18. The memristive learning neuromorphic circuit of claim 17, wherein the first feedback signal is anti-phase with the second feedback signal.

19. The memristive learning neuromorphic circuit of claim 17, wherein the feedback circuit adjusts a phase of at least one of the first feedback signal and the second feedback signal according to the difference or error between the target signal and the second oscillatory signal.

20. The memristive learning neuromorphic circuit of claim 15, wherein:
- the first oscillatory signal comprises a magnitude and a phase; and
- in the memristive learning neuromorphic circuit, the magnitude is used to transmit information between the first oscillatory-based neuron and the second oscillatory-based neuron, and the phase is used to modify a connection strength between the first oscillatory-based neuron and the second oscillatory-based neuron.

* * * * *